United States Patent
Itoh et al.

(10) Patent No.: US 6,181,186 B1
(45) Date of Patent: Jan. 30, 2001

(54) POWER TRANSISTOR WITH OVER-CURRENT PROTECTION CONTROLLER

(75) Inventors: Yukio Itoh; Takao Arai, both of Tokyo (JP)

(73) Assignee: NEC Corporation, Tokyo (JP)

(*) Notice: Under 35 U.S.C. 154(b), the term of this patent shall be extended for 0 days.

(21) Appl. No.: 09/337,678

(22) Filed: Jun. 22, 1999

(30) Foreign Application Priority Data

Jun. 24, 1998 (JP) ................................. 10-177833

(51) Int. Cl.[7] .................................................. H03K 5/08
(52) U.S. Cl. ....................... 327/309; 327/543; 327/538; 327/427; 361/93
(58) Field of Search ......................... 327/309, 108, 327/109, 110, 111, 77, 306, 540, 541, 543, 538, 427, 434; 361/18, 91, 93

(56) References Cited

U.S. PATENT DOCUMENTS

| | | | |
|---|---|---|---|
| 5,008,586 | * | 4/1991 | Miyazaki et al. ............. 323/315 |
| 5,369,308 | * | 11/1994 | Schoofs et al. ............... 327/427 |
| 5,422,593 | * | 6/1995 | Fujihara ....................... 327/561 |
| 5,541,799 | * | 7/1996 | Schmidt et al. ............... 361/18 |
| 5,621,601 | * | 4/1997 | Fujihara et al. .............. 361/93 |
| 5,789,971 | * | 8/1998 | Colletti et al. ................ 327/541 |
| 5,796,278 | * | 8/1998 | Osborn et al. ................ 327/108 |
| 5,801,573 | * | 9/1998 | Kelly et al. ................... 327/434 |

FOREIGN PATENT DOCUMENTS 3-238869  10/1991 (JP).

OTHER PUBLICATIONS

Nikkei Electronics, "MOSFET", (Jul. 28, 1986), pp. 144–145.*

* cited by examiner

Primary Examiner—Timothy P. Callahan
Assistant Examiner—Hai L. Nguyen
(74) Attorney, Agent, or Firm—Sughrue, Mion, Zinn, Macpeak & Seas, PLLC

(57) ABSTRACT

A semiconductor device enables a semiconductor element to turn off accurately and quickly at the time of short circuit of the load to protect the semiconductor element from the short circuit of the load. The semiconductor device comprises a first switching measure for turning on/off a current flowing into the load, a current detector for detecting current flowing into the load, a second switching measure for turning on/off a connection between the current detector and the load, and a controller for controlling the first switching measure and the second switching measure. The controller turns on the first switching measure, before turning on the second switching measure at the start of driving of the load. The current detector turns off the first switching measure when detecting excess current.

41 Claims, 11 Drawing Sheets

POWER TRANSISTOR WITH OVER-CURRENT PROTECTION CONTROLLER

BACKGROUND OF THE INVENTION

The present invention relates to a semiconductor device in which a protection circuit is added to power semiconductor elements such as power MOSFET, IGBT, and so forth.

DESCRIPTION OF THE PRIOR ART

Formerly, for instance, a protection circuit of the semiconductor device disclosed in the Japanese Patent Application Laid-Open No. HEI 3-238869 is known, and a circuit diagram of the protection circuit is shown in FIG. 1. In this circuit, when a potential of a drain of both of a MOSFET Q1 and a MOSFET Q2 is increased while short-circuiting a load connected in between a drain terminal D and a power terminal which is not illustrated, a voltage to be larger than a voltage generated normally is generated in the resistors R20 and R30 which are connected to the MOSFET Q2. When this voltage value reaches a threshold voltage value of the MOSFET Q3, the MOSFET Q3 turns on to decrease a gate voltage of the MOSFET Q1, and the MOSFET Q2, thus it is capable of controlling a current of the MOSFET Q1.

However, in this semiconductor device, since the gate of both of the MOSFET Q1 and the MOSFET Q2 is common, in case where the load is short-circuited, the voltage generated in the resistor is increased, thus a gate voltage of both of the MOSFET Q1 and the MOSFET Q2 is decreased. Then, also the drain current of the MOSFET Q2 is reduced, thus the voltage generated in the resistor is decreased, with the result that this causes the gate voltage of the MOSFET Q1 and the MOSFET Q2 to increase again to render the drain current large again. This operation is repeated to the state where the drain current converges on a certain fixed value.

There was the problem that the semiconductor device is destroyed caused by the large current flowing therethrough until the drain current converges according to an operation condition of the semiconductor device or a condition of a short circuit of the load.

Further, since there is scarcely voltage drop due to the load at the time of a short circuit of the load, so a power voltage is directory applied between drain/source of the MOSFET Q1, even though the drain current is restricted, at the time point, the electric power consumed by the semiconductor device is large, therefore there was the problem that the semiconductor device is destroyed by heat if the heat resistance is not reduced by increase of the chip size or substituting the large type package therefor.

As the method for achieving such defect, the feedback circuit is added in such a way that it detects state of the load and state of input voltage, causing gate voltage to be reset in connection with the first MOSFET Q1 and the second MOSFET Q2. Such method is disclosed in NIKKEI ELECTRONICS (1986, 7, 28 P. 144, 145). However, there was the problem that in order to newly form the feedback circuit which consists of latch, an operation amplifier, a reference voltage, it becomes necessary to re-investigate the manufacturing process of the semiconductor, and space for layout increases, and cost up occurs.

SUMMARY OF THE INVENTION

In view of the foregoing, it is an object of the present invention, in order to overcome the above-mentioned problems, to provide a semiconductor device in which it becomes unnecessary to re-investigate the manufacturing process of the semiconductor, and space for layout does not increase, and cost up does not occur, in such a way that the semiconductor device causes semiconductor element to be turned off at the time of short circuit of the load to protect the semiconductor element from the short circuit of the load.

According to a first aspect of the present invention in order to achieve the above mentioned object, there is provided a semiconductor device which comprises a first switching means for turning on/off a current flowing into a load, a current detector for detecting the current flowing into the load, a second switching means for switching on/off a connection between the current detector and the load, and a controller for controlling the second switching means and the first switching means, wherein the controller, at a time when the load starts driving, turns on the first switching means, before turns on the second switching means, and the current detector turns off only the first switching means when detecting an excess current.

According to a second aspect of the present invention, in the first aspect, there is provided a semiconductor device, wherein the first switching means and the second switching means are transistors, the current detector is a resistor provided in between the second switching means and a ground point, and the controller consists of a control terminal provided at an input line of the first switching means, resistors connected to the control terminal, and latch for inputting a signal from an intermediate point of said resistors and outputting a control signal to an input line of the second switching means.

According to a third aspect of the present invention, in the second aspect, there is provided a semiconductor device, wherein the first switching means and the second switching means are MOSFETs.

According to a fourth aspect of the present invention, in the second aspect, there is provided a semiconductor device, wherein the first switching means and the second switching means are IGBTs.

According to a fifth aspect of the present invention, in the third aspect, there is provided a semiconductor device, wherein the current detector is depletion type MOSFET whose gate and source are short-circuited.

According to a sixth aspect of the present invention, in any one of the first aspect to the fifth aspect, there is provided a semiconductor device, wherein the semiconductor device is formed within an identical semiconductor.

According to a seventh aspect of the present invention, in any one of the first aspect to the sixth aspect, there is provided a semiconductor device, wherein serially connected in between an input terminal and an output terminal of the first switching means are a clamping diode for clamping a potential of the output terminal of the first switching means, and a reverse-current prevention diode for preventing a current flowing from the input terminal of the switching means towards the output terminal of the same.

According to an eighth aspect of the present invention, in the seventh aspect, there is provided a semiconductor device, wherein the clamping diode is a voltage regulation diode with guard ring structure.

According to a ninth aspect of the present invention, in the seventh aspect or in the eighth aspect, wherein the reverse-current prevention diode is formed by a polycrystal semiconductor over an insulating film.

According to a tenth aspect of the present invention, in any one of the first aspect to the sixth aspect, there is provided a semiconductor device, wherein a bidirectional voltage regulation diode is connected in between the input terminal and the output terminal of the first switching means.

According to an eleventh aspect of the present invention, in the tenth aspect, there is provided a semiconductor device as claimed in claim 32, wherein the bidirectional voltage regulation diode is formed by a polycrystal semiconductor over an insulating film.

The above and further objects and novel features of the invention will be more fully understood from the following detailed description when the same is read in connection with the accompanying drawings. It should be expressly understood, however, that the drawings are for purpose of illustration only and are not intended as a definition of the limits of the invention.

DETAILED DESCRIPTION OF THE PREFERRED EMBODIMENT

A preferred embodiment of the present invention will be described in detail in accordance with the accompanying drawings.

Figure 1:
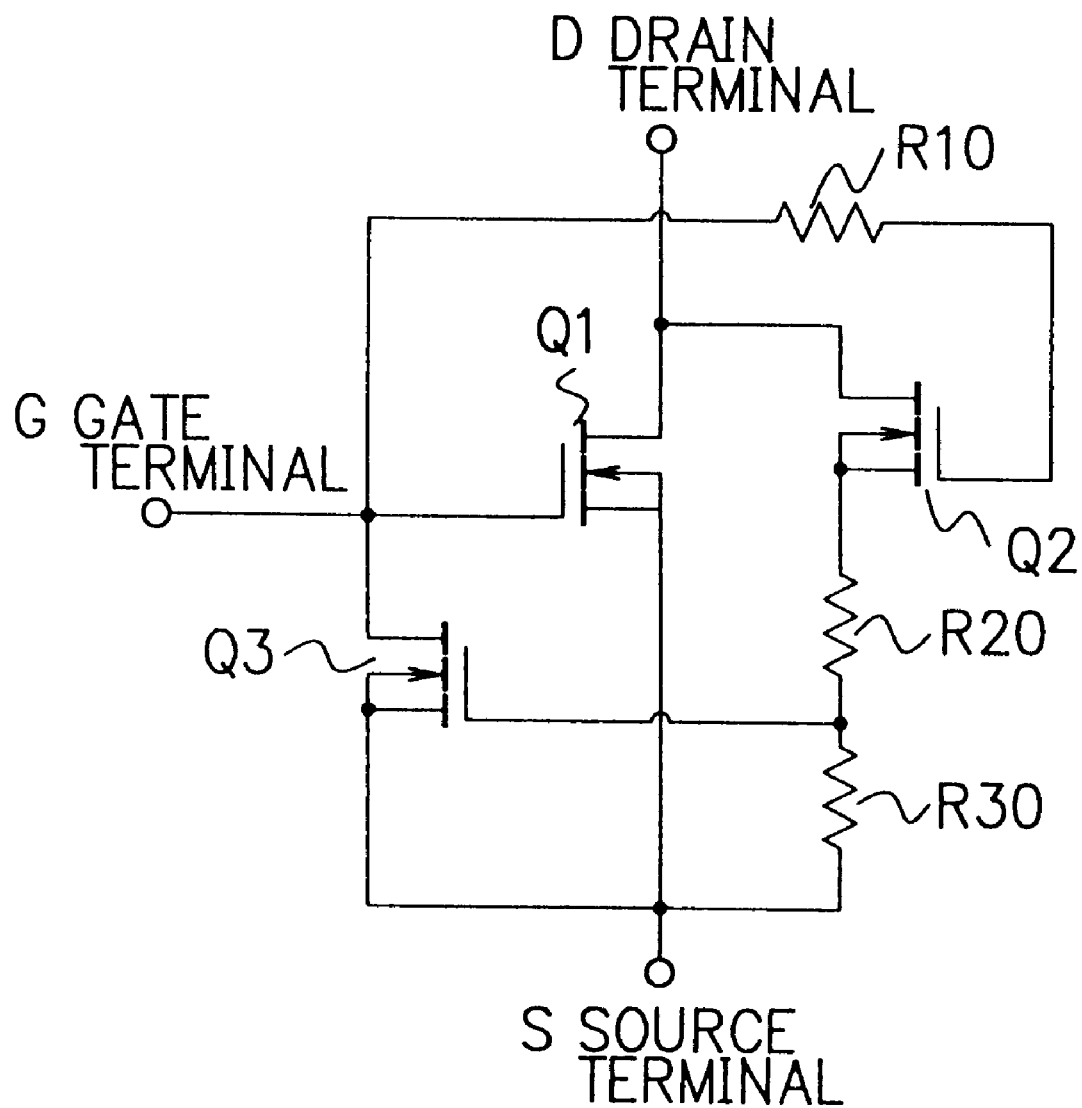
FIG. 1 is a circuit diagram of the conventional example.
Figure 2:
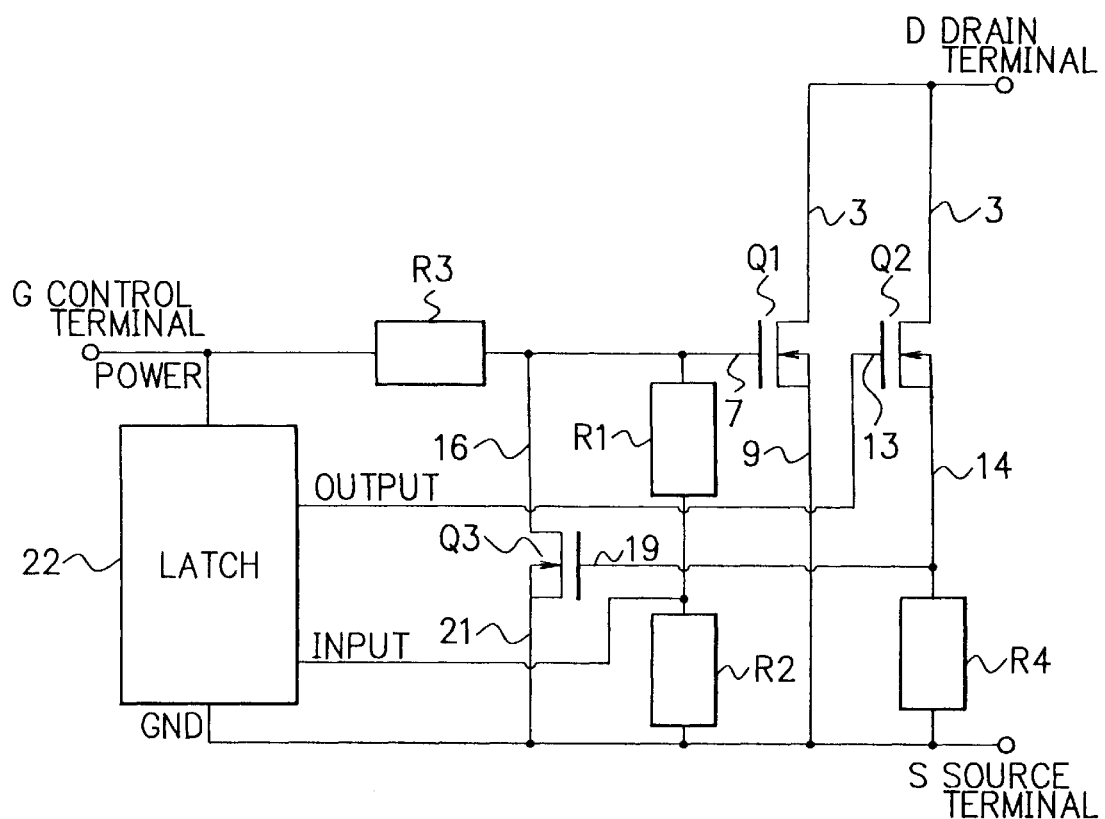
FIG. 2 is a block diagram showing a first embodiment of the present invention.
Figure 3:
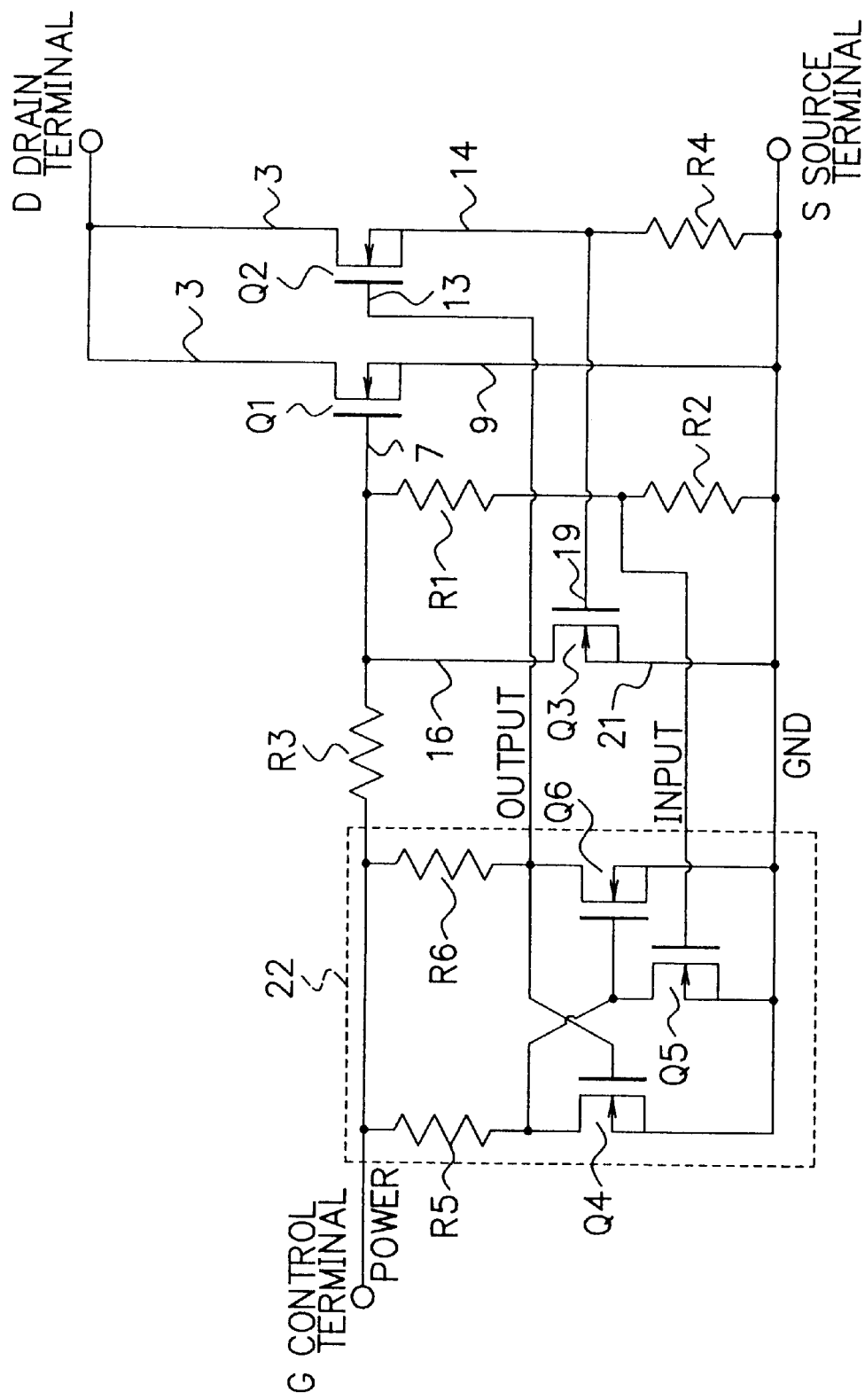
FIG. 3 is a circuit diagram showing the first embodiment of the present invention.
Figure 4:
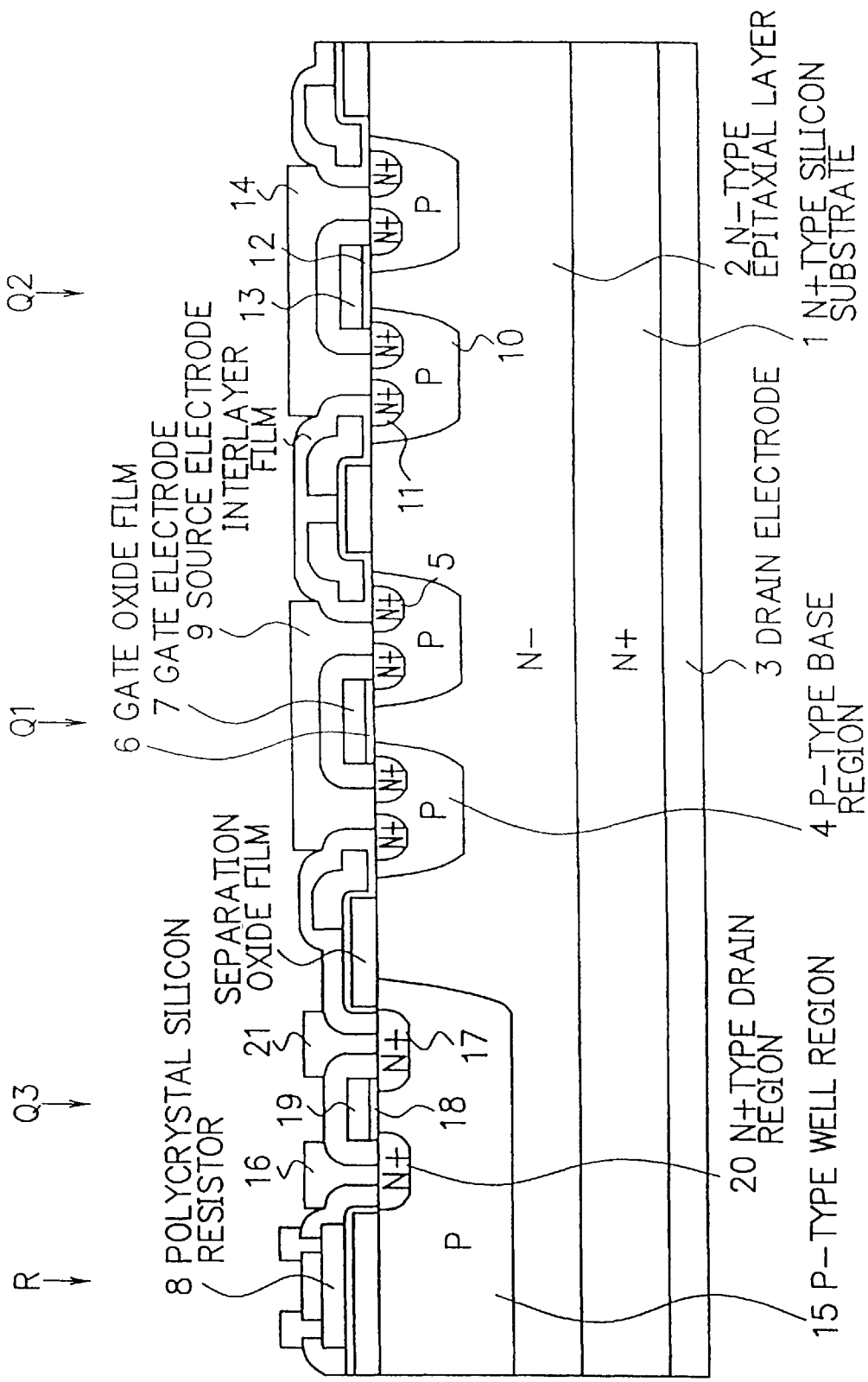
FIG. 4 is a sectional view showing a semiconductor chip of the first embodiment of the present invention.

A first embodiment of the present invention will be described referring to FIG. 2, FIG. 3, and FIG. 4. FIG. 2 is a block diagram showing a first embodiment of the present invention. FIG. 3 is a circuit diagram showing the first embodiment of the present invention. FIG. 4 is a sectional view showing a semiconductor chip. In the following description, in the same part of respective drawings, the same reference numerals are added to avoid repeated description.

The present embodiment, as shown in FIG. 4, has a power MOSFET (Metal-Oxide-Semiconductor Field Effect Transistor) Q1 and a MOSFET Q2 provided commonly at N-type epitaxial layer 2 which is developed on N+ type silicon substrate 1.

The above-described power MOSFET Q1 with the N-type epitaxial layer 2 as a drain region, has a drain electrode 3, a P-type base region 4, an N+ type source region 5, a gate oxide film 6, a gate electrode 7, and a source electrode 9.

Further, the above-described MOSFET Q2 with the N-type epitaxial layer 2 as a drain region, has a drain electrode 3, a P-type base region 10, an N+ type source region 11, a gate oxide film 12, a gate electrode 13, and a source electrode 14.

A MOSFET Q3 is provided on the inside of a P-type well region 15 formed on the N-type epitaxial layer 2. The MOSFET Q3 has a drain electrode 16, an N+ type source region 17, a gate oxide film 18, a gate electrode 19, an N+ type drain region 20, and a source electrode 21. Further, the MOSFETs Q4, Q5, and Q6 shown in FIG. 3 have the same configuration as the MOSFET Q3.

Resistor elements R1 to R6 are polycrystal silicon resistor 8 formed by polycrystal silicon film.

Connection of the above elements will be described referring to FIG. 2. The gate electrode 7 of the MOSFET Q1 is connected to one end of the resistor element R1, the drain electrode 16 of the MOSFET Q3, and one end of the resistor element R3. The source electrode 9 of the MOSFET Q1 is connected to a source terminal S. Further, the drain electrode 3 of the MOSFET Q1 is connected to a drain terminal D.

The gate electrode 13 of the MOSFET Q2 is connected to output line of latch 22. The source electrode 14 of the MOSFET Q2 is connected to one end of the resistor element R4 and the gate electrode 19 of the MOSFET Q3. Another end of the resistor element R4 and the source electrode 21 of the MOSFET Q3 are connected to the source terminal S. The drain electrode 3 of the MOSFET Q2 is connected to the drain terminal D.

The resistor elements R1 and R2 are inserted in series between the gate electrode 7 of the MOSFET Q1 and the source terminal S. The resistor element R3 is inserted between the gate electrode 7 of the MOSFET Q1 and the control terminal G. An intermediate point of the resistor element R1 and the resistor element R2 is connected to an input line of latch 22.

The resistor element R3 is inserted between the gate electrode 7 of the MOSFET Q1 and the control terminal G. A power supply of latch 22 is connected to the control terminal G. A GND (ground) of latch 22 is connected to the source terminal S.

Detailed internal configuration of latch 22 will be described referring to FIG. 3. The input line of latch 22 is connected to the gate electrode of the MOSFET Q5. The drain electrode of the MOSFET Q5 is connected to each of the gate electrode of the MOSFET Q6, the drain electrode of the MOSFET Q4, and one end of the resistor element R5. Another end of the resistor element R5 is connected to the power of latch 22. The source electrode of the MOSFET Q5 is connected to the GND of latch 22.

The gate electrode of the MOSFET Q4 is connected to an output line of latch 22, a drain electrode of the MOSFET Q6, and one end of a resistor element R6. Another end of the resistor element R6 is connected to the power line of latch 22. The source electrode of the MOSFET Q4 and the MOSFET Q6 are connected to the GND of latch 22. The ratio of the resistor element R5 to the resistor element R6 becomes degree of 1:3. At this time in order to equalize a current driving ability of the MOSFET Q4 and the MOSFET Q6, the gate electrode of the MOSFET Q4 and the MOSFET Q6 is formed equally with respect to its length and width.

Otherwise, as a different configuration, rendering the resistance value of R5 and R6 equal, thus size of the gate electrode is formed three times thereof in such a way that the current driving ability of the MOSFET Q4 becomes degree of three times of the MOSFET Q6.

Further, ON-resistance of the MOSFET Q3 is sufficiently smaller than a resistance value of R3. ON-resistance of the MOSFET Q4 and the MOSFET Q5 is sufficiently smaller than a resistance value of R5. ON-resistance of the MOSFET Q6 is sufficiently smaller than a resistance value of R6.

Furthermore, in FIG. 4, if a reverse conductive type P+ type silicon substrate is substituted for the N+ type silicon substrate 1, it is capable of changing Q1, and Q2 of MOSFET into IGBT.

Figure 5:
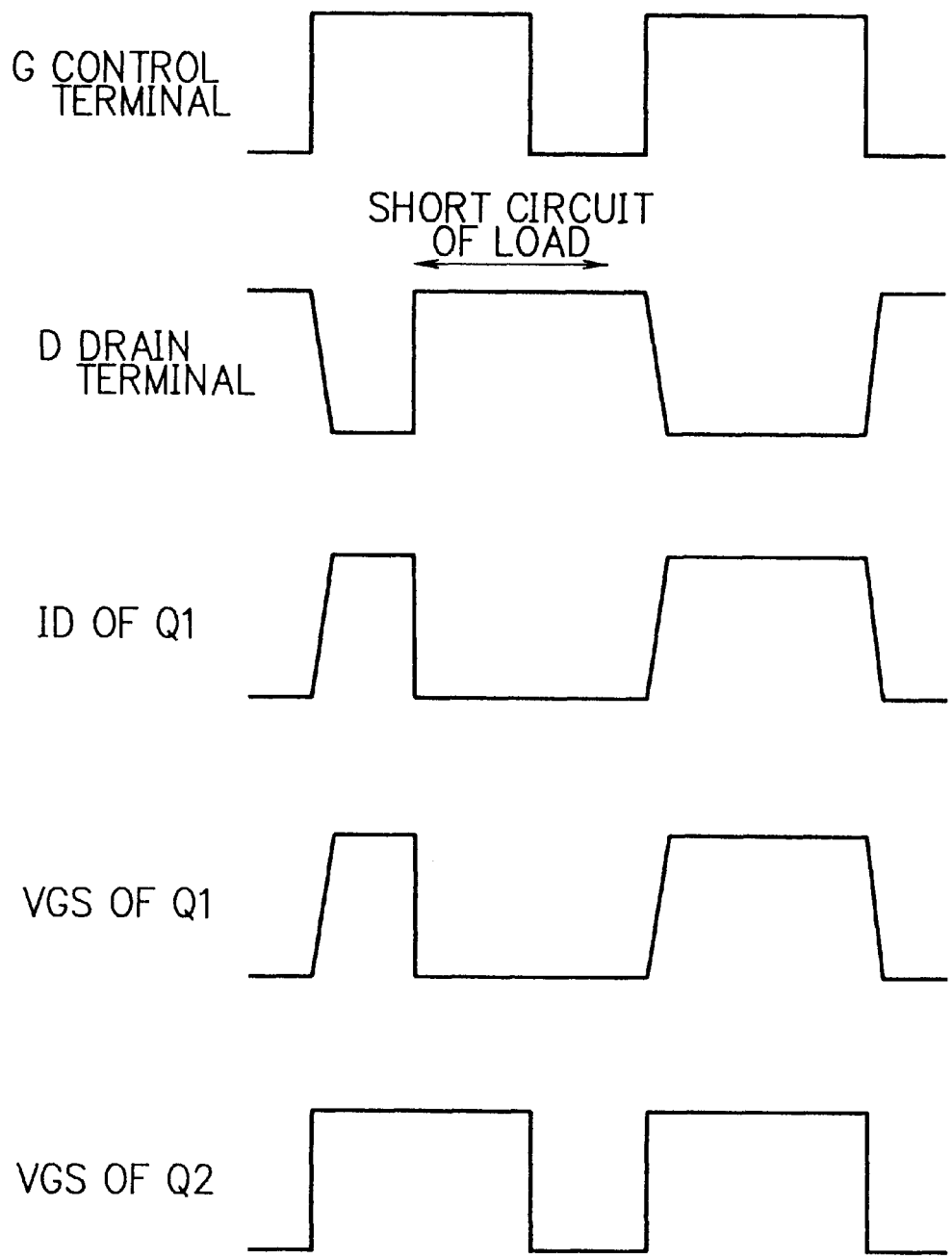
FIG. 5 is a wave form view showing the first embodiment of the present invention.

Next, operation of the first embodiment will be described referring to wave form diagram of FIG. 5. When positive voltage is applied to the control terminal G, the power MOSFET Q1 turns on.

At this time, the positive voltage is also applied to the power line of latch 22. If the positive voltage is larger than the threshold voltage value of the MOSFET Q4 and the MOSFET Q6, the MOSFET Q6 turns on according to resistance ratio of the R5 and the R6, or ratio of a current driving ability of the MOSFET Q4 and the MOSFET Q6, thus an output of latch 22 becomes LOW voltage.

When the positive voltage is applied to the control terminal G, current flows into the R1 and the R2. When the voltage generated on both end of the R2 becomes larger than the threshold value voltage of the MOSFET Q5, the MOSFET Q5 turns on, with the result that the MOSFET Q6 turns off, thus the drain electrode of the MOSFET Q6 becomes the same potential of the control terminal G so that the MOSFET Q2 turns on.

Namely, when the positive voltage is applied to the control terminal G, the MOSFET Q1 turns on, before the MOSFET Q2 turns on according to function of latch 22. This is to prevent error that when the large current flows between the drain and the source of the MOSFET Q2 in such way that the MOSFET Q2 with small input capacity turns on before the MOSFET Q1, which is regarded as load short-circuited accidentally.

Next, in cases where the load connected between the drain terminal D and a power terminal of the whole circuit which is not illustrated is short-circuited, potential of the drain terminal D is increased to flow large current in the MOSFET Q2 and the MOSFET Q4 so that large voltage which is not generated normally is generated on both ends of the R4. The voltage reaches on the threshold value voltage of the MOSFET Q3 to turns on, so that the potential of the gate electrode 7 of the MOSFET Q1 is decreased, thus the MOSFET Q1 is turned off. At this time, the potential of the gate electrode 13 of the MOSFET Q2 does not change, therefore, the MOSFET Q2 maintains on state.

When the operation causes the positive voltage applied to the control terminal G to be zero, the MOSFET Q2 turns off, also the MOSFET Q3 turns off.

Short-circuit of the load is repaired to turn to normal state, then the positive voltage is applied to the control terminal G again, with the result that the MOSFET Q1 turns on to return to normal operation.

Figure 6:
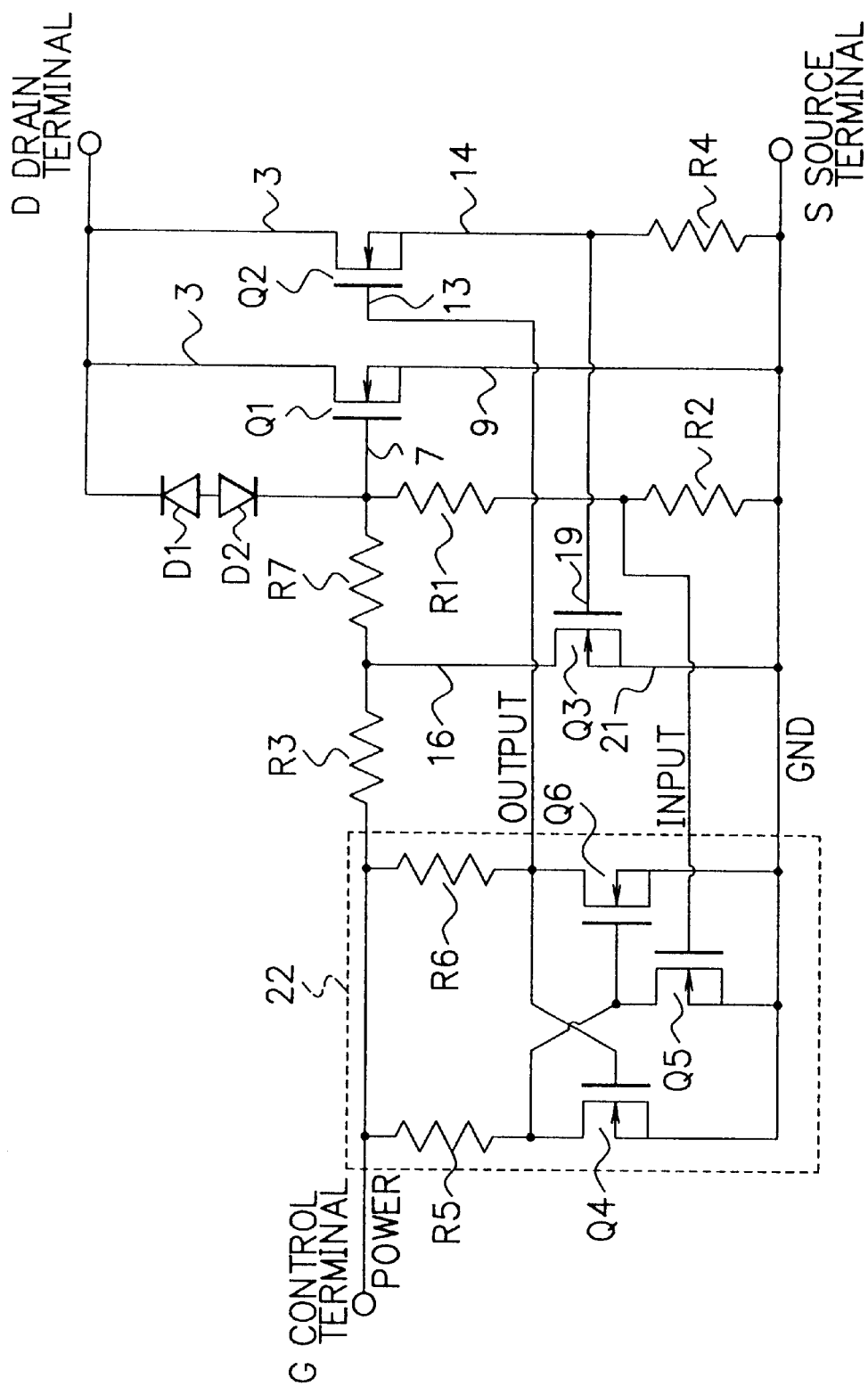
FIG. 6 is a circuit view of a second embodiment of the present invention.
Figure 7:
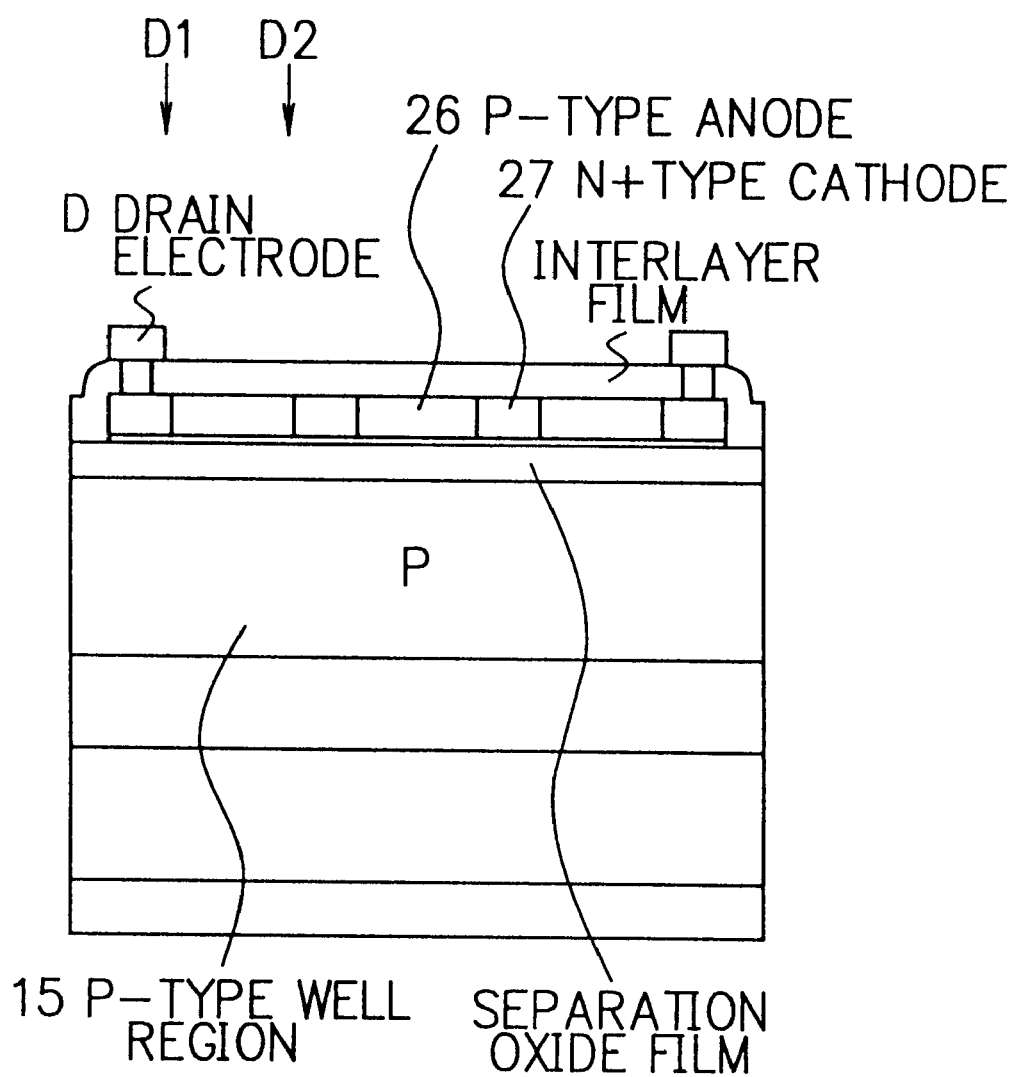
FIG. 7 is a sectional view showing a semiconductor chip of the second embodiment of the present invention.

FIG. 6 is a circuit view of a second embodiment of the present invention. FIG. 7 is a sectional view showing a semiconductor chip of the second embodiment of the present invention. In the second embodiment, there is provided a bi-directional diode which comprises a clamping diode D1 for clamping the potential of the drain terminal D, and a reverse-current prevention diode D2 which prevents current flowing from the control terminal G to the drain terminal D, thus being connected in series as being the bi-directional diode. A plurality of bi-directional diodes which are connected in series are inserted between the drain terminal D and the gate electrode 7 of the power MOSFET Q1. Further, the resistor element R7 is inserted between the gate electrode 7 of the power MOSFET Q1 and the resistor element R3.

The clamping diode D1 and the reverse-current prevention diode D2 are made of polycrystal silicon film as shown in FIG. 7. The P-type polycrystal silicon which forms P-type anode 26 is formed in the same way as a P-type base region 4 of the power MOSFET Q1. Further, the N+ type polycrystal silicon which forms the N+ type cathode 27 is formed in the same way as the N+ type source region 5 of the power MOSFET Q1. Further, the R7 is made of polycrystal silicon film in the same way as the R1 to R6.

In cases where a load is inductance, the second embodiment causes an applied voltage of the control terminal G to be decreased to zero to turn off Q1, counter-electromotive force is generated in the drain terminal D. In this case, the clamping diode D1 undergoes a breakdown. Current of the breakdown flows into the control terminal G through the R7 and R3. The power MOSFET Q1 turns on, so that dynamic clamping operation occurs in such a way that the power MOSFET Q1 absorbs counter-electromotive force.

The moment the MOSFET Q3 turns on caused by the short circuit of the load to turn off the MOSFET Q1, the reverse-electromotive force is generated in the drain terminal D according to parasitic inductance included in the wiring and so forth. In this case, the clamping diode D1 undergoes a breakdown, thus the breakdown current flows into the source terminal S through the R7 and the MOSFET Q3 which is on. The MOSFET Q1 turns on, and the MOSFET Q1 absorbs the reverse-electromotive force.

As described above, it is capable of absorbing the reverse-electromotive force at the time of short circuit of the load due to the dynamic clamping operation according to function of the R7.

Further the R7 stays a dV/dt in a low level which dV/dt is generated when the reverse-electromotive force is generated in the drain terminal D. Thus the R7 accomplishes a role for avoiding operation of parasitic NPN bipolar transistor generated in P-type well region 15 of the MOSFET Q3.

Figure 8:
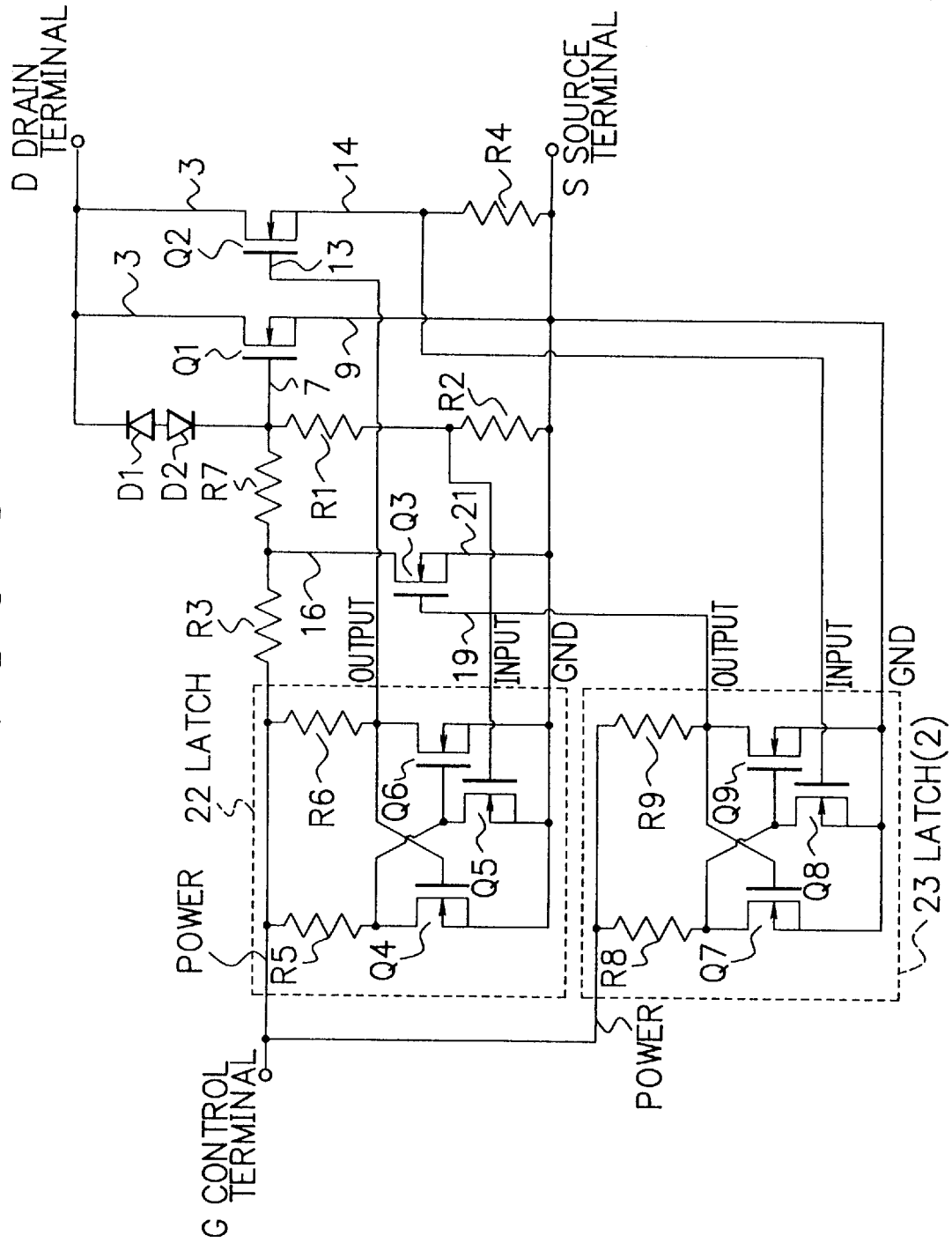
FIG. 8 is a circuit diagram showing a third embodiment of the present invention.

Next, a third embodiment of the present invention will be described referring to a circuit diagram of FIG. 8. In the third embodiment, latch (2) 23 to be a second latch is added to the second embodiment. An input line of latch (2) 23 is connected to the source electrode 14 of the MOSFET Q2, and an output line thereof is connected to the gate electrode 19 of the MOSFET Q3. Internal configuration of latch (2) 23 is the same as that of latch 22 of the second embodiment.

When large voltage is generated on both ends of the R4 while occurring a short circuit of the load and so forth, the voltage reaches the threshold value voltage of the MOSFET Q8 to operate latch (2) 23, thus increasing the voltage of the gate electrode 19 of the MOSFET Q3 to equal voltage to the gate terminal G. Consequently, it is capable of driving the MOSFET Q3 with the sufficiently high gate voltage, therefore, it is capable of designing a channel width of the MOSFET Q3 efficiently small.

Figure 9:
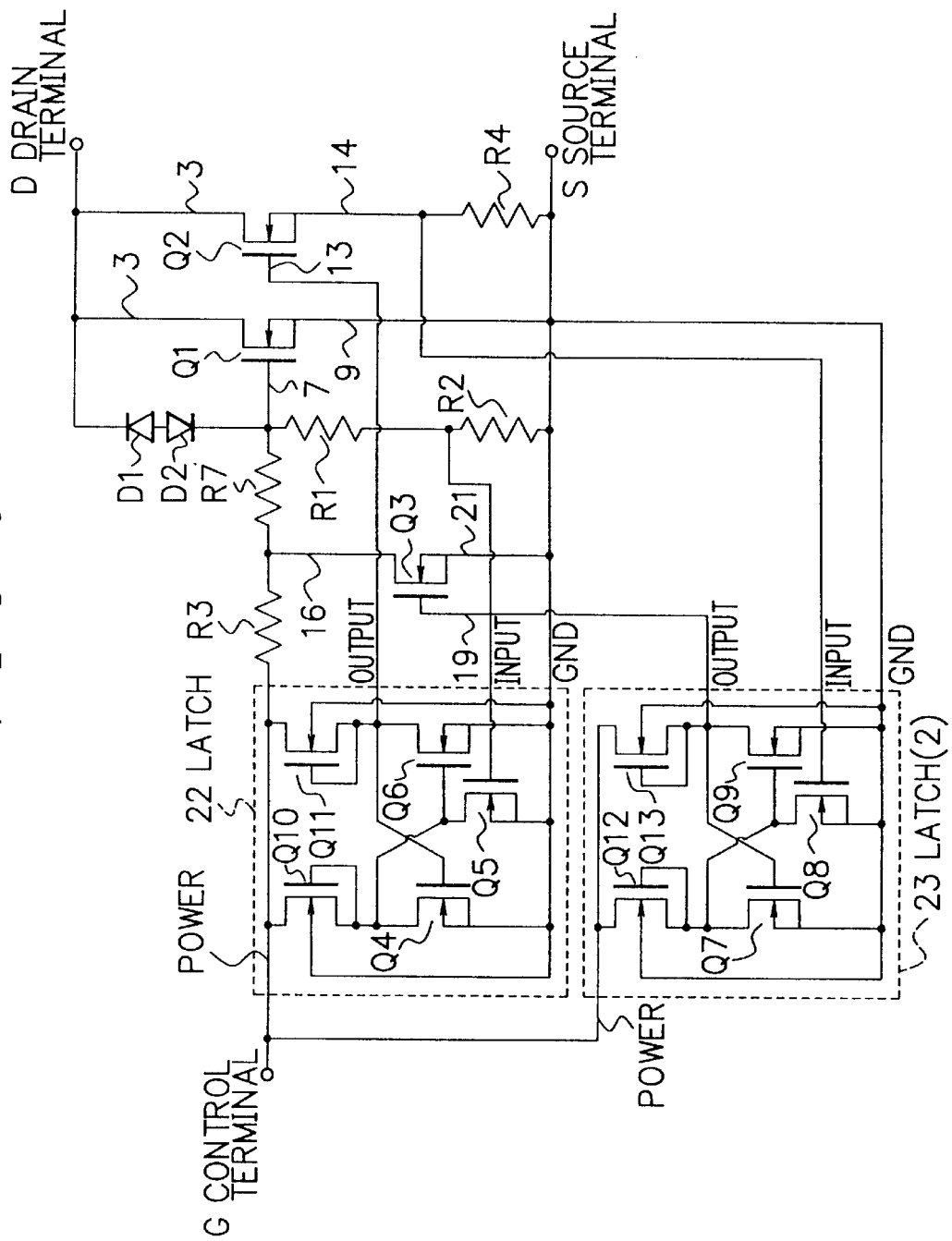
FIG. 9 is a circuit view showing a fourth embodiment of the present invention.

FIG. 9 is a circuit diagram showing a fourth embodiment of the present invention. In the fourth embodiment, the polycrystal silicon resistors R5, R6, R8, R9 of latch 22 and latch (2) 23 are substituted for depletion type MOSFET Q10 to Q13 whose the gate and the source are short-circuited. These MOSFET Q10 to MOSFET Q13 operate in the same way as that of the polycrystal silicon resistors R5, R6, R8, and R9.

Figure 10:
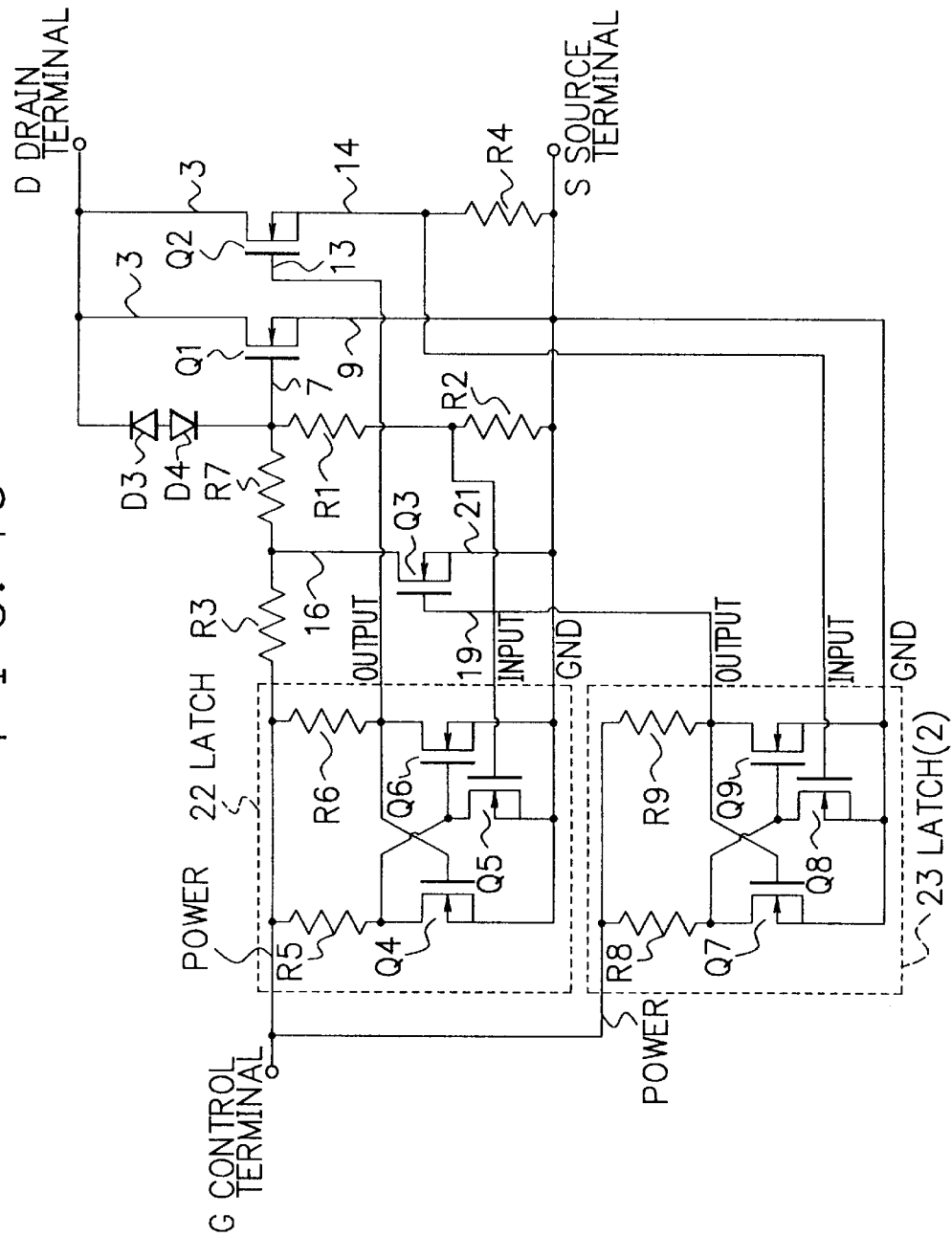
FIG. 10 is a circuit view showing a fifth embodiment of the present invention.
Figure 11:
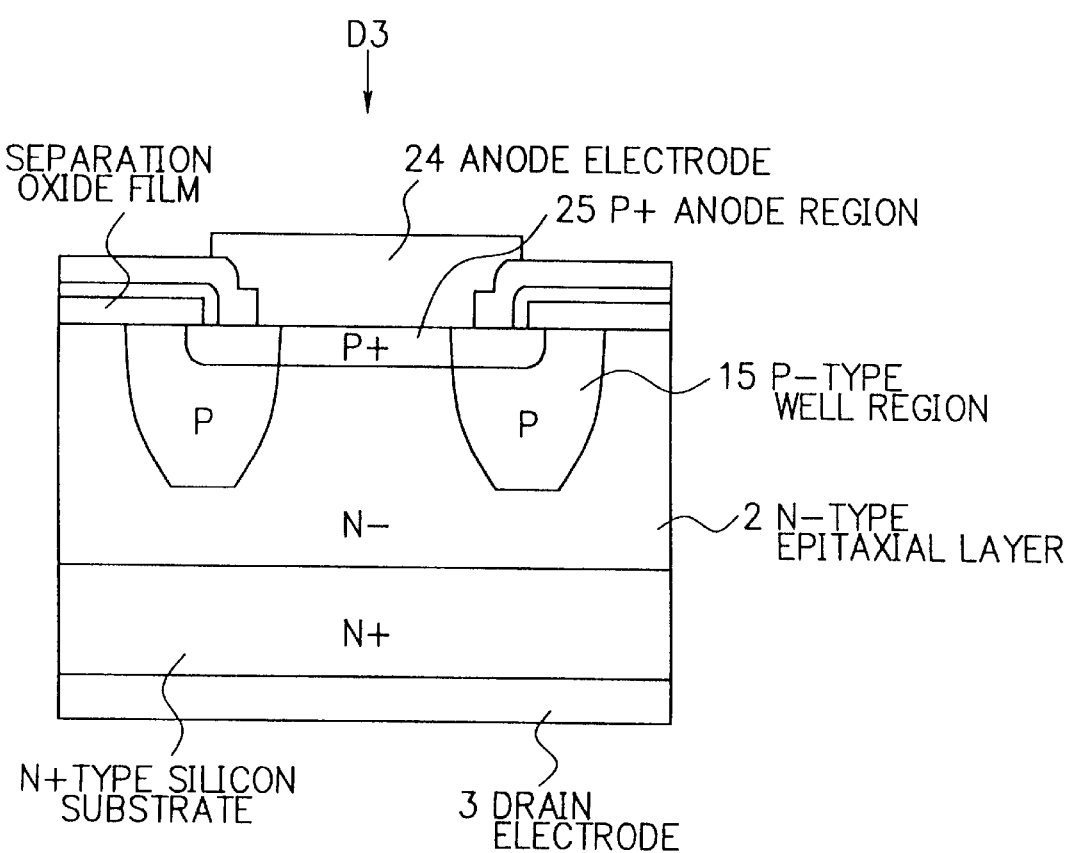
FIG. 11 is a sectional view showing a semiconductor chip of the fifth embodiment of the present invention.

FIGS. 10 and 11 are a circuit diagram of a fifth embodiment of the present invention and a sectional view showing a semiconductor chip respectively. In the fifth embodiment, a plurality of clamping diode D1 and the reverse-current prevention diode D2 in the second embodiment are substituted for only respective one stage of diode D3 and diode D4.

Further, sectional construction of the semiconductor chip is construction shown in FIG. 11, and above described diode D3 is formed on N-type epitaxial layer 2. An anode electrode 24 of the D3 is connected to a P+ anode region 25 whose circumference is surrounded by a P-type well region 15, thus forming anode layer. A cathode layer is above described N-type epitaxial layer 2. Namely, the D3 is a voltage regulation diode with the P-type well region 15 as guard ring.

As described above according to the present invention, the semiconductor device comprises a first switching means for turning on/off current flowing into a load, a current detector for detecting current flowing into the load, a second switching means for turning on/off the connection between the current detector and the load, and a controller for controlling the first switching means and the second switching means, wherein the controller turns on the first switching means at the start of driving of the load, before turning on the second switching means, and the current detector turns off only the first switching means when detecting excess current, therefore, when the excess current is detected, only the first switching means which drives the load is turned off, at the time when the second switching means is not turned off. Consequently, the connection between the current detector and the load is not disconnected, thus detection of the excess current is continued. Consequently, the first switching means is turned off accurately and quickly, thus the excess current flowing into the load is turned off accurately and quickly, therefore, it is capable of protecting the semiconductor device accurately from the excess current in case where the load is short-circuited.

Further, at the start of driving of the load, the first switching means is turned on, before the second switching means is turned on, therefore, the load current is not turned off while turning off the first switching means unnecessarily when large current flows into only the second switching means and the current detector to decide it as the short circuit of the load accidentally.

Furthermore, the clamping diode for clamping the potential of output terminal of the first switching means and the reverse-current prevention diode for preventing current from the input terminal of the first switching means to the output terminal are connected in series between the input terminal and the output terminal of the first switching means, therefore, when the load is inductance, or when parasitic inductance is involved in wiring and so forth, the semiconductor device is protected accurately because the reverse-electromotive force is generated when the first switching means is turned off is absorbed by the fact that the clamping diode undergoes breakdown.

While preferred embodiments of the invention have been described using specific terms, the description has been for illustrative purpose only, and it is to be understood that changes and variations may be made without departing from the spirit or scope of the following claims

What is claimed is:

1. A semiconductor device comprising:
   a first switching means for turning on/off a current flowing into a load;
   a current detector for detecting the current flowing into said load;
   a second switching means for switching on/off a connection between said current detector and said load; and
   a controller for controlling said second switching means and said first switching means,
   wherein said controller, at a time when the load starts driving, turns on said first switching means, before turns on said second switching means, and said current detector turns off only said first switching means when detecting an excess current.

2. A semiconductor device as claimed in claim 1, wherein:
   said first switching means and said second switching means are transistors;
   said current detector is resistor provided in between said second switching means and a ground point; and
   said controller consists of a control terminal provided at an input line of said first switching means, resistors connected to said control terminal, and latch for inputting a signal from an intermediate point of said resistors and outputting a control signal to an input line of said second switching means.

3. A semiconductor device as claimed in claim 2, wherein:
   said first switching means and said second switching means are MOSFETs.

4. A semiconductor device as claimed in claim 2, wherein:
   said first switching means and second switching means are IGBTs.

5. A semiconductor device as claimed in claim 3, wherein:
   said current detector is depletion type MOSFET whose gate and source are short-circuited.

6. A semiconductor device as claimed in claim 1, wherein:
   said semiconductor device is formed within an identical semiconductor.

7. A semiconductor device as claimed in claim 2, wherein:
   said semiconductor device is formed within an identical semiconductor.

8. A semiconductor device as claimed in claim 3, wherein:
   said semiconductor device is formed within an identical semiconductor.

9. A semiconductor device as claimed in claim 4, wherein:
   said semiconductor device is formed within an identical semiconductor.

10. A semiconductor device as claimed in claim 5, wherein:
    said semiconductor device is formed within an identical semiconductor.

11. A semiconductor device as claimed in claim 1, wherein:
    serially connected in between an input terminal and an output terminal of said first switching means are a clamping diode for clamping a potential of the output terminal of said first switching means, and a reverse-current prevention diode for preventing a current flowing from the input terminal of said switching means towards the output terminal of the same.

12. A semiconductor device as claimed in claim 2, wherein:
    serially connected in between an input terminal and an output terminal of said first switching means are a clamping diode for clamping a potential of the output terminal of said first switching means, and a reverse-current prevention diode for preventing a current flowing from the input terminal of said switching means towards the output terminal of the same.

13. A semiconductor device as claimed in claim 3, wherein:
    serially connected in between an input terminal and an output terminal of said first switching means are a clamping diode for clamping a potential of the output terminal of said first switching means, and a reverse-current prevention diode for preventing a current flowing from the input terminal of said switching means towards the output terminal of the same.

14. A semiconductor device as claimed in claim 4, wherein:

serially connected in between an input terminal and an output terminal of said first switching means are a clamping diode for clamping a potential of the output terminal of said first switching means, and a reverse-current prevention diode for preventing a current flowing from the input terminal of said switching means towards the output terminal of the same.

15. A semiconductor device as claimed in claim 5, wherein:

serially connected in between an input terminal and an output terminal of said first switching means are a clamping diode for clamping a potential of the output terminal of said first switching means, and a reverse-current prevention diode for preventing a current flowing from the input terminal of said switching means towards the output terminal of the same.

16. A semiconductor device as claimed in claim 6, wherein:

serially connected in between an input terminal and an output terminal of said first switching means are a clamping diode for clamping a potential of the output terminal of said first switching means, and a reverse-current prevention diode for preventing a current flowing from the input terminal of said switching means towards the output terminal of the same.

17. A semiconductor device as claimed in claim 11, wherein:

said clamping diode is a voltage regulation diode with guard ring structure.

18. A semiconductor device as claimed in claim 12, wherein:

said clamping diode is a voltage regulation diode with guard ring structure.

19. A semiconductor device as claimed in claim 13, wherein:

said clamping diode is a voltage regulation diode with guard ring structure.

20. A semiconductor device as claimed in claim 14, wherein:

said clamping diode is a voltage regulation diode with guard ring structure.

21. A semiconductor device as claimed in claim 15, wherein:

said clamping diode is a voltage regulation diode with guard ring structure.

22. A semiconductor device as claimed in claim 16, wherein:

said clamping diode is a voltage regulation diode with guard ring structure.

23. A semiconductor device as claimed in claim 11, wherein:

said reverse-current prevention diode is formed by a polycrystal semiconductor over an insulating film.

24. A semiconductor device as claimed in claim 12, wherein:

said reverse-current prevention diode is formed by a polycrystal semiconductor over an insulating film.

25. A semiconductor device as claimed in claim 13, wherein:

said reverse-current prevention diode is formed by a polycrystal semiconductor over an insulating film.

26. A semiconductor device as claimed in claim 14, wherein:

said reverse-current prevention diode is formed by a polycrystal semiconductor over an insulating film.

27. A semiconductor device as claimed in claim 15, wherein:

said reverse-current prevention diode is formed by a polycrystal semiconductor over an insulating film.

28. A semiconductor device as claimed in claim 16, wherein:

said reverse-current prevention diode is formed by a polycrystal semiconductor over an insulating film.

29. A semiconductor device as claimed in claim 17, wherein:

said reverse-current prevention diode is formed by a polycrystal semiconductor over an insulating film.

30. A semiconductor device as claimed in claim 1, wherein:

a bi-directional voltage regulation diode is connected in between the input terminal and output terminal of said first switching means.

31. A semiconductor device as claimed in claim 2, wherein:

a bi-directional voltage regulation diode is connected in between the input terminal and output terminal of said first switching means.

32. A semiconductor device as claimed in claim 3, wherein:

a bi-directional voltage regulation diode is connected in between the input terminal and output terminal of said first switching means.

33. A semiconductor device as claimed in claim 4, wherein:

a bi-directional voltage regulation diode is connected in between the input terminal and output terminal of said first switching means.

34. A semiconductor device as claimed in claim 5, wherein:

a bi-directional voltage regulation diode is connected in between the input terminal and output terminal of said first switching means.

35. A semiconductor device as claimed in claim 6, wherein:

a bi-directional voltage regulation diode is connected in between the input terminal and output terminal of said first switching means.

36. A semiconductor device as claimed in claim 30, wherein:

said bi-directional voltage regulation diode is formed by a polycrystal semiconductor over an insulating film.

37. A semiconductor device as claimed in claim 31, wherein:

said bi-directional voltage regulation diode is formed by a polycrystal semiconductor over an insulating film.

38. A semiconductor device as claimed in claim 32, wherein:

said bi-directional voltage regulation diode is formed by a polycrystal semiconductor over an insulating film.

39. A semiconductor device as claimed in claim 33, wherein:

said bi-directional voltage regulation diode is formed by a polycrystal semiconductor over an insulating film.

40. A semiconductor device as claimed in claim 34, wherein:

said bi-directional voltage regulation diode is formed by a polycrystal semiconductor over an insulating film.

41. A semiconductor device as claimed in claim 35, wherein:

said bi-directional voltage regulation diode is formed by a polycrystal semiconductor over an insulating film.

* * * * *